United States Patent
Marcoux et al.

Patent Number: 5,791,243
Date of Patent: Aug. 11, 1998

[54] CARTRIDGE SQUEEGEE HEAD WITH ENGAGEMENT LOCKING MECHANISM

[75] Inventors: Richard A. Marcoux, Pelham, N.H.; Mark Curtin, Boston, Mass.

[73] Assignee: Transition Automation, Inc., N. Billerica, Mass.

[21] Appl. No.: 804,692

[22] Filed: Feb. 25, 1997

[51] Int. Cl.$^6$ .................................................. B41C 17/04
[52] U.S. Cl. .................................................. 101/123; 101/127
[58] Field of Search ........................... 101/123, 125, 101/126, 129, 114, 127

[56] References Cited

U.S. PATENT DOCUMENTS

| | | | |
|---|---|---|---|
| 2,783,709 | 3/1957 | Thomas | 101/123 |
| 2,863,382 | 12/1958 | Giani | 101/123 |
| 3,505,951 | 4/1970 | Gartrell | 101/123 |
| 4,023,486 | 5/1977 | Linthicum et al. | 101/123 |
| 4,248,150 | 2/1981 | Lala | 101/123 |
| 4,254,707 | 3/1981 | Lambert et al. | 101/123 |
| 4,404,903 | 9/1983 | Cronin | 101/123 |
| 4,729,306 | 3/1988 | Bubley | 101/123 |
| 5,458,060 | 10/1995 | Casl | 101/123 |
| 5,611,274 | 3/1997 | Tani | 101/123 |
| 5,649,479 | 7/1997 | Hoffman | 101/123 |
| 5,660,632 | 8/1997 | Volpe, Jr. et al. | 101/123 |

*Primary Examiner*—Eugene H. Eickholt
*Attorney, Agent, or Firm*—Samuels, Gauthier, Stevens & Reppert

[57] ABSTRACT

A cartridge squeegee head for solder paste machines. A squeegee blade is fixed to a coupling block. The coupling block is characterized by a coupling slot formed therein. The coupling block pivots and puts the squeegee blade into a print stroke position. The squeegee blade is then driven across the stencil foil surface.

12 Claims, 4 Drawing Sheets

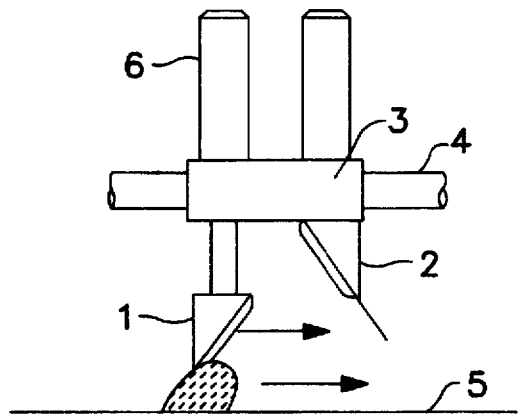
FIG. IA
PRIOR ART
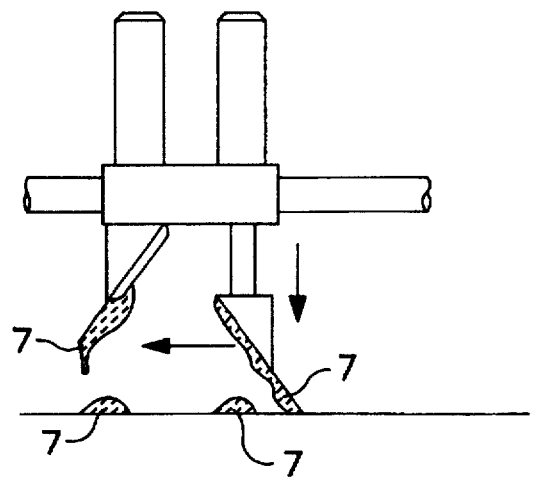
FIG. IB
PRIOR ART

5,791,243

CARTRIDGE SQUEEGEE HEAD WITH ENGAGEMENT LOCKING MECHANISM

FIELD OF THE INVENTION

The invention relates to a squeegee head for a solder paste applicator.

BACKGROUND AND BRIEF SUMMARY OF THE INVENTION

State-of-the-art solder paste printing machines are exemplified in FIGS. 1a and 1b. Typically two squeegees blades 1 and 2 are attached to a translation head 3 which is generally referred to as "the squeegee head". This head 3 has bearing elements which connect to linear rods 4 located above a stencil foil 5. There is a driving mechanism which drives the squeegee head back and forth along the linear rods and there are vertical actuators 6 to bring each squeegee blade into contact with the stencil foil during the print stroke.

These machines are generally integral units with only the squeegee blades per se being easily replaced. One problem with these dual squeegee machines arises because solder paste 7 is very sticky and attaches to every surface it contacts, as shown in FIG. 1b. In these machines, the solder paste 7 is alternatively pushed forward and back with the back squeegee and front squeegee respectively. At the end of each print cycle, each squeegee is moved up out of contact with the stencil foil 5. After several cycles of printing, the paste 7 gets spread out and sticks to the front squeegee 1, the back squeegee 2 and the stencil. Because the paste is originally down on the stencil and each squeegee moves down, contacts and pushes the paste and then is moved up again, the paste hangs and drips from each squeegee 1 and 2. At other times in the print cycle, the squeegee head 3 moves to a position outside of the print area, e.g. to allow CCD cameras to travel into and view areas in the middle of the print area. During these movements hanging, dripping solder paste falls into delicate aperture areas, or into the other areas of the printing machine.

A good printing process requires that all the solder paste remain together with a minimal amount of surface area exposed. The sticking, dripping and separation of solder paste which occurs because the squeegee head is moved away from the stencil foil causes the paste to become spread around. The consequence is that the paste dries and becomes ineffective in the printing operation. Further, the paste which drips and hangs can cause machine problems and printing defects if the paste falls into the printer apertures.

The present invention discloses a cartridge squeegee head which is separated from the translation head when not in use. When the squeegee stroke is activated, an upper protruding coupling ram moves downwardly and locks into a coupling slot formed in the squeegee head. This coupling tilts the squeegee head to a predetermined blade angle, e.g. 60°, and locks the squeegee head into this angle during the print stroke. This locking is strong enough to hold the squeegee head in a stable orientation while other torques and forces act on the squeegee head during the squeegee print stroke. When the print stroke is reversed these steps are reversed and the locking and tilting features are mirrored on the squeegee head.

This invention improves solder paste application in the surface mount technology printing process by containing the solder paste in a substantially hermetically sealed contamination-free chamber defined by the two squeegee blades, by paste retainer walls at the ends of the squeegee blades and a stencil foil. This invention reduces solder paste exposure to air and therefore reduces the amount of solder paste which is wasted due to drying out. The invention improves the quality of the printing process by maintaining fresh solder paste in the chamber. The invention preserves the paste's natural rolling action by allowing enough room inside the chamber for the paste to flow and not be trapped by the surfaces. The invention eliminates the problem of solder paste sticking to the squeegee translation head and falling into other areas of the printer and causing defects.

This invention improves print quality by eliminating the possibility that paste will fall into the stencil apertures. Paste is not left hanging on a suspended squeegee, up over the stencil when the translation head moves for other related actions, e.g. movements to home for equipment reset, for camera translation and when the cameras are incorporated onto the squeegee translation head.

This invention eliminates defects from dry paste, and reduces solder paste waste by keeping the solder paste contained in a small nearly air tight chamber and minimizes solder paste surface area.

This invention enables the translation head to be used for other functions, such as camera mounting and translation, and allows the translation head to make moves over the stencil foil without the concern and problems created by dripping solder paste.

Broadly the invention comprises a cartridge squeegee head for solder paste machines comprising at least one squeegee blade fixedly secured to a coupling block, the coupling block characterized by a coupling slot formed therein, the blade adapted to wipe a stencil foil. The coupling block pivots and puts the squeegee blade into a print stroke position. The squeegee blade is then driven across the stencil foil surface. In a preferred embodiment of the invention there are two mirror image squeegee blades for alternate forward and reverse print strokes.

BRIEF DESCRIPTION OF THE DRAWINGS

FIGS. 1a and 1b are illustrations of prior art solder paste printing machine;

DESCRIPTION OF THE PREFERRED EMBODIMENT(S)

Figure 2A:
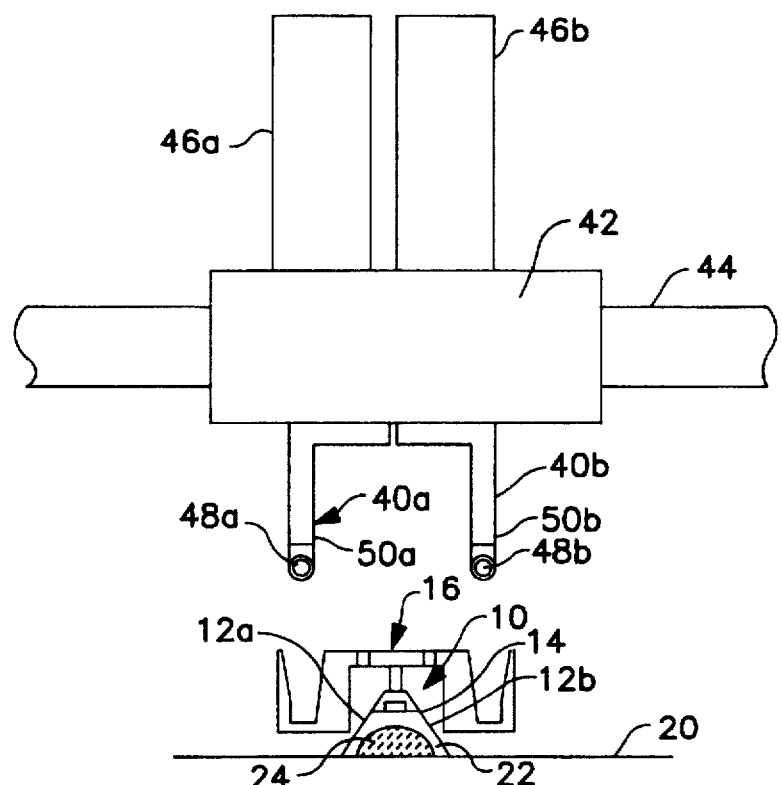
FIGS. 2a and 2b are illustrations of the solder paste printing machine of the invention where the squeegee head is engaged and disengaged.
Figure 2B:
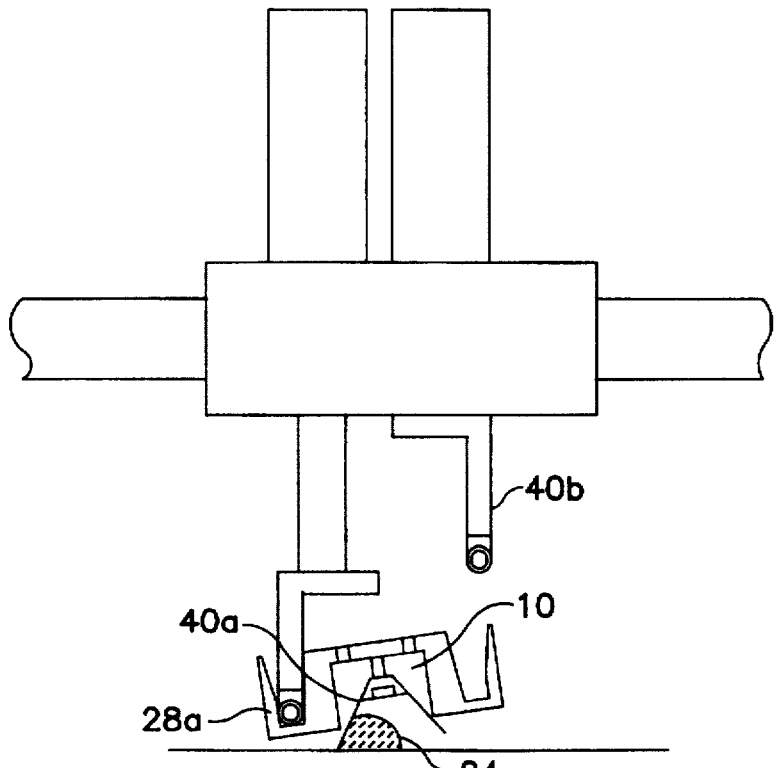

Referring to FIGS. 2a and 2b, a cartridge squeegee head is shown generally at 10 and comprises two squeegee blades 12a and 12b, the blades are fixedly secured in a V-shaped groove in a longitudinal holder 14 which is secured (such as by bolting) to a coupling block 16.

Figure 4:
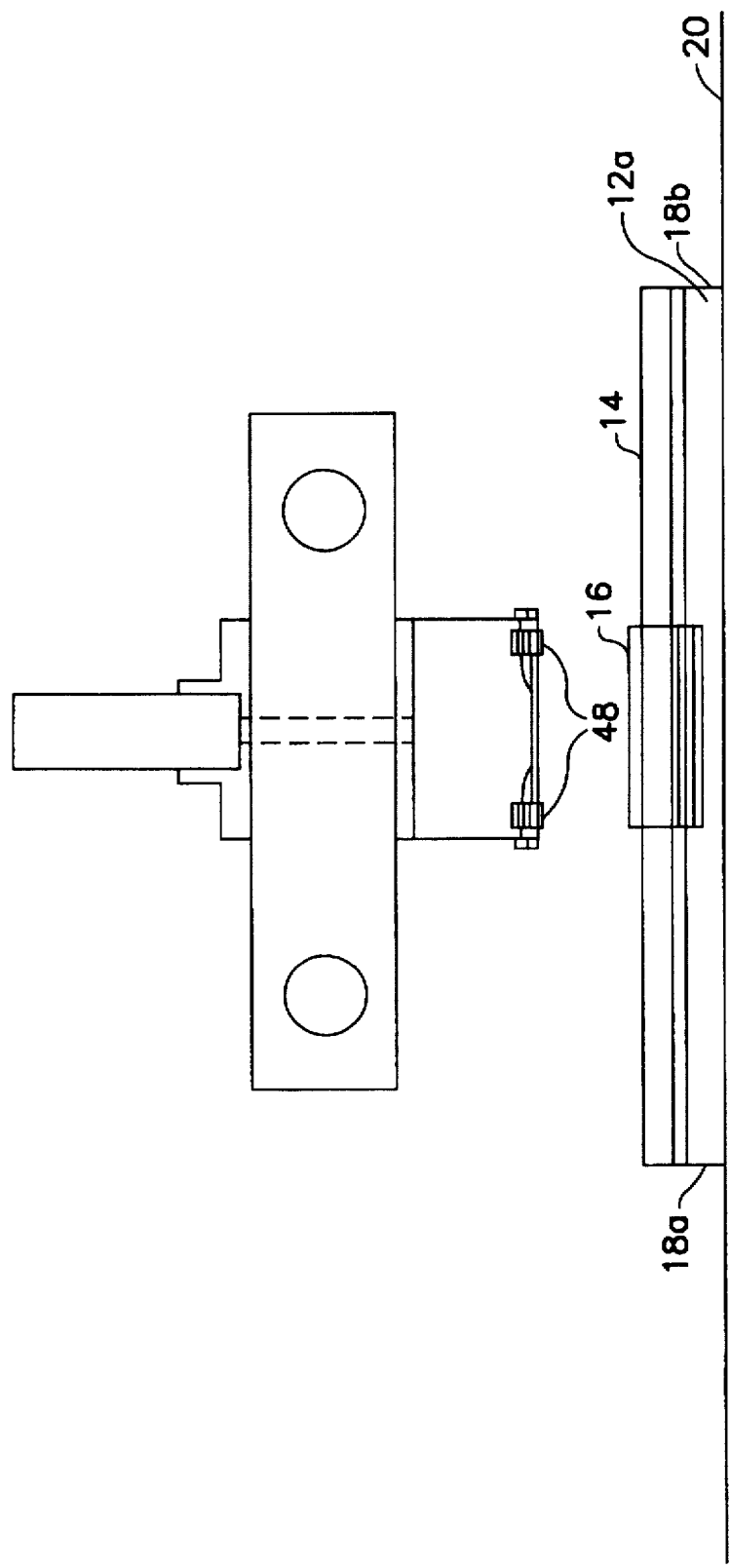
FIG. 4 is an illustration of an end view of a solder paste printing machine.

Referring to FIG. 4, paste retainer end plates 18a and 18b are secured to the ends of the squeegee blades 12a and 12b. The squeegee blades 12a and 12b, together with the retaining plates 18a and 18b, define with a stencil foil or surface 20 a substantially hermetically sealed chamber 22. FIG. 2a. Solder paste 24 is contained with the chamber 22.

Figure 3:
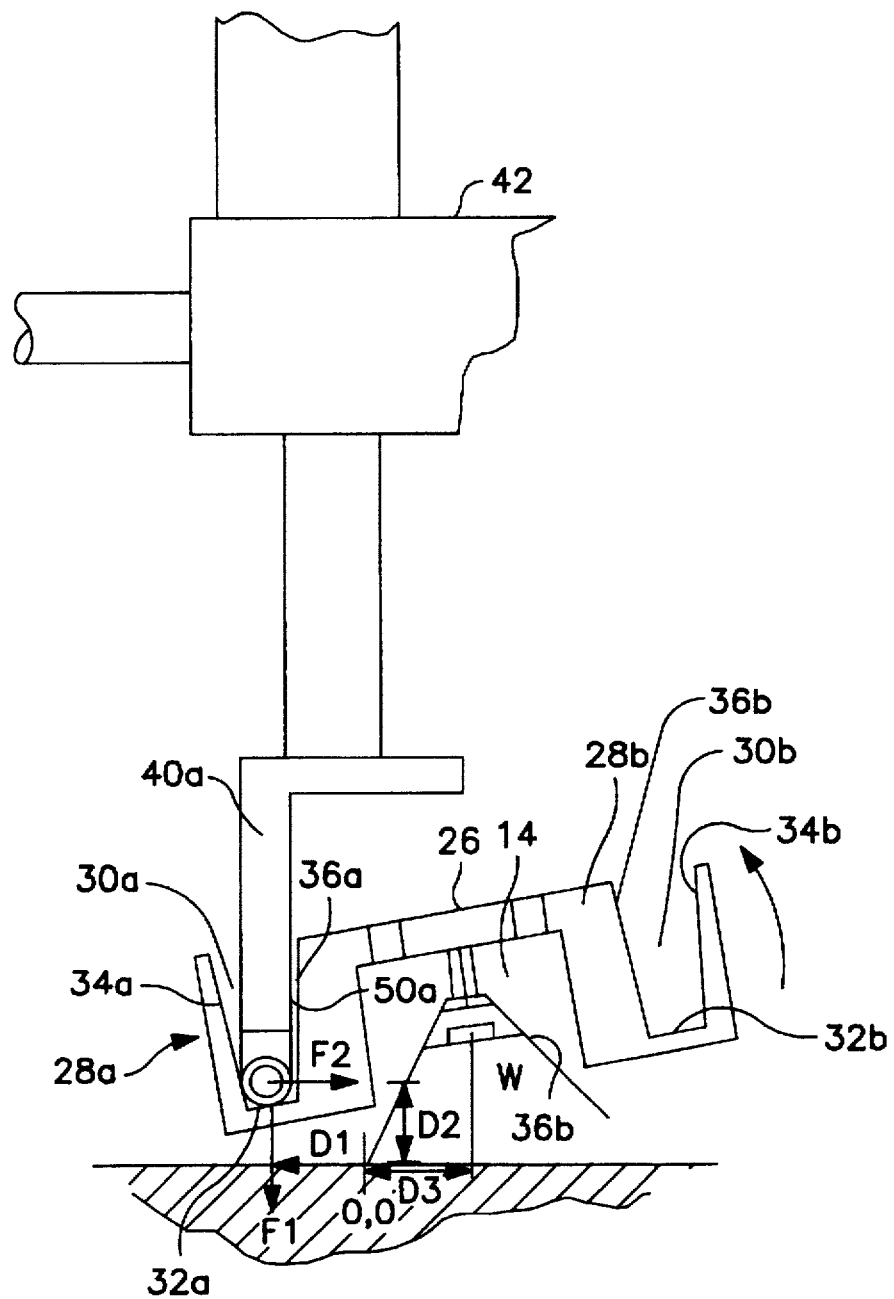
FIG. 3 is a fragmentary illustration of the clamping, locking and pivoting motion of the squeegee head.

Referring to FIG. 3, the coupling block 16 comprises a shoulder plate 26 to which is secured the holder 14. The shoulder plate 26 has depending U-shaped arms 28a and 28b. The arms 28a and 28b define coupling slots 30a and 30b. The slots 30a and 30b are more specifically defined by bearing surfaces 32a and 32b and opposed surfaces 34a and 36a and 36a and 36b respectively.

As will be described hereinafter, the squeegee head 10 is detached from the translation head. The motion of the squeegee head 10 is minimized to translation along the stencil surface and to pivotable motion. The advantages of the invention are possible because of the tilting and locking features.

Referring to FIGS. 2a and 2b, vertically actuating coupling rams 40a and 40b are mounted to a translation head 42 which travels on linear rods 44 (only one shown). The rams 40 have a vertical movement with respect to the rods 44. Bearing guided air cylinders 46a and 46b are used to effect the vertical motion. The leading edges of the coupling rams 40a and 40b are characterized by bearings 48a and 48b. The rams 40a and 40b are also characterized by bearing surfaces 50a and 50b.

FIG. 2a illustrates the squeegee head decoupled. FIG. 2b illustrates the positive coupling after vertical actuation of the coupling ram 40a. In the operation of the invention, the guided air cylinder 46a moves the coupling ram 40a down and pushes it into the recessed slot 30a. The driving of the coupling ram 40a into the recessed slot 30a results in rotation or pivoting of the entire squeegee head 10, causing the squeegee blade 12a to engage the stencil surface in a print position. The other squeegee blade 12b rotates in the same direction and moves up off the stencil surface a minimal amount. The coupling design allows for some positional error between the ram and the engaged slot. If there is any misalignment, the lower cartridge squeegee head 10 will straighten and align with the protruding coupling ram 40a.

Another important interaction between the engaging pieces is a locking and limiting action caused by the contact between surfaces 36a and 50a. Referring to FIG. 3, when the ram 40a pushes and causes the rotation of the squeegee head 10, the rotation is limited by contact between the opposed surfaces 36a and 50a. This limiting action locks the squeegee head 10 into a fixed position and maintains this position. This position is maintained while the translation head 42 is activated during the squeegee stroke to push the squeegee and solder paste across the stencil for printing.

When activated, the coupling mechanism will tilt the squeegee head 10 so that the squeegee blade 12a will tilt to 60° with respect to the stencil surface.

When the protruding coupling ram 40a is pushed down into the slot 30a the squeegee head assembly 10 is trapped between the coupling ram 40a and the stencil surface and underlying tooling support. This creates a torque upon the whole squeegee head 10 defined as the push force F1 and the moment arm D1. This torque causes the squeegee head 10 to pivot in the direction shown by the arrow. The squeegee head 10 pivots until the surfaces 36a and 50a engage. The squeegee head 10 is then locked into position. The translation head is then actuated to cause all the aforementioned elements to translate across the stencil surface. During this translation there are opposing torques developed as indicated as F2xD2 and WxD3. The positive torque F1xD1 is designed to be greater than the opposing torques F2xD2+WxD3.

The squeegee head and coupling design are bi-direction. That is, when the print stroke is completed, the squeegee stroke is reversed. The coupling ram 40a withdraws. To effect the reverse stroke the coupling ram 40b drives into the associated slot 30b. If the squeegee head is not precisely aligned with the coupling ram, the squeegee head will reposition itself as the coupling ram 40b continues to drive and lock into the slot 30b. The process as just described for the coupling of the ram is then simply reversed with the squeegee blade 12a pivoting away from the stencil surface and the squeegee blade 12b engaging the printing surface in a print position followed subsequently by the transition head driving the squeegee head in a reverse direction.

This invention makes setup and breakdown easier because there is no disassembly of the squeegees from the translation head. The squeegee head is always separated (when not activated) and therefore, to clean up, add paste or make changes, the user simply has to enter the printing work space and pick up the cartridge squeegee head.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described our invention, what we now claim is:

1. A cartridge squeegee head for solder paste printing machines comprising:

a first squeegee blade fixedly secured to a coupling block, the blade adapted to wipe a stencil foil;

means for pivoting the coupling block and locking the first blade in a print stroke position, the axis of rotation of said pivoting being the edge of the squeegee blade; and means for moving the squeegee blade across a stencil foil surface while locked in the print stroke position.

2. The head of claim 1 comprising:

a second squeegee blade fixedly secured to the coupling block in an orientation which is the mirror image of the one squeegee blade wherein when the first blade in its print stroke position and moved through a forward print stroke the second blade is out of position; and means for pivoting the coupling block to a second position to place the second blade in a print stroke position when the squeegee head is moved in a reverse print stroke.

3. The head of claim 2 wherein the squeegee blades in the print stroke position define an angle of approximately 60° with the stencil foil surface.

4. The head of claim 2 wherein the squeegee blades are secured to the coupling block such that the edges of the squeegee blade function as the axes of rotation when the coupling block pivots.

5. The head of claims 2, 3 or 4 wherein the squeegee blades have ends and retaining walls are secured to the ends of the squeegee blades whereby the blades, the ends and the stencil surface define a chamber for the solder paste.

6. A solder paste printing machine which comprises:

a first squeegee blade fixedly secured to a coupling block, the blade adapted to wipe a stencil foil, the coupling block characterized by a first coupling slot formed therein, the first slot adapted to receive a first coupling ram;

a transition head having the first coupling ram secured thereto;

means for driving the first ram into the first slot to lock the first blade in a print stroke position; and means for driving the first blade across the stencil foil while locked in the print stroke position.

7. The machine of claim 6 wherein the first slot is U-shaped and is characterized by an inner bearing surface, the first ram is characterized by a bearing surface which engages the bearing surface of the first slot, the dimensioning of these bearing surfaces determining the degree of rotation of the coupling block.

8. The machine of claim 6 comprising:

a second squeegee blade fixedly secured to the coupling block in an orientation which is the mirror image of the one squeegee, blade, the coupling block is characterized by a second slot, the second slot adapted to receive a second coupling ram;

the second coupling ram secured to the transition head means;

means for driving the second ram into the second slot to lock the second blade in a print stroke position; and means for driving the second blade across the stencil foil while locked in the print stroke position.

9. The machine of claim 8 wherein the second slot is U-shaped and is characterized by an inner bearing surface, the second ram is characterized by a bearing surface which engages the bearing surface of the second slot, the dimensioning of these bearing surfaces determining the degree of rotation of the coupling block.

10. The machine of claim 8 wherein the squeegee blades define an angle of approximately 60° with the stencil foil surface in the print stroke position.

11. The machine of claim 8 wherein the squeegee blades are secured to the coupling block such that their edges function as the axes of rotation when the coupling block pivots.

12. The head of claims 8, 9, 10 or 11 wherein the squeegee blades have ends and retaining walls are secured to the ends of the squeegee blades whereby the blades, the ends and the stencil surface define a chamber for the solder paste.

* * * * *

UNITED STATES PATENT AND TRADEMARK OFFICE
CERTIFICATE OF CORRECTION

PATENT NO. : 5,791,243
DATED : August 11, 1998
INVENTOR(S) : Richard A. Marcoux and Mark Curtin It is certified that error appears in the above-indentified patent and that said Letters Patent is hereby corrected as shown below:

Column 6, line 14, cancel "head" and insert --machine--.

Signed and Sealed this

Fifth Day of January, 1999

Attest:

Attesting Officer

*Acting Commissioner of Patents and Trademarks*